United States Patent
Wu

(10) Patent No.: US 8,891,732 B2
(45) Date of Patent: Nov. 18, 2014

(54) APPARATUS AND METHOD FOR DETECTING MARKS AND SEMICONDUCTOR DEVICE PROCESSING SYSTEM

(75) Inventor: Qiang Wu, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 350 days.

(21) Appl. No.: 13/325,017

(22) Filed: Dec. 13, 2011

(65) Prior Publication Data

US 2013/0083890 A1 Apr. 4, 2013

(30) Foreign Application Priority Data

Sep. 29, 2011 (CN) .......................... 2011 1 0300891

(51) Int. Cl.
*G01N 23/04* (2006.01)
*G03F 9/00* (2006.01)

(52) U.S. Cl.
CPC ............ *G03F 9/7065* (2013.01); *G03F 9/7084* (2013.01)
USPC ................................ 378/62; 378/34; 378/205

(58) Field of Classification Search
CPC ......... G01N 23/04; G21K 1/06; G21K 1/062; G21K 1/067; G21K 2201/06; G21K 2201/061
USPC ........................................ 378/34, 205, 62, 70
See application file for complete search history.

(56) References Cited

U.S. PATENT DOCUMENTS

| | | | | |
|---|---|---|---|---|
| 4,809,308 A * | 2/1989 | Adams et al. | ................. | 378/98.2 |
| 4,870,648 A * | 9/1989 | Ceglio et al. | .................. | 378/145 |
| 5,192,869 A * | 3/1993 | Kumakhov | ................... | 378/145 |
| 5,412,705 A * | 5/1995 | Snoeren et al. | .............. | 378/98.3 |
| 5,457,726 A * | 10/1995 | Miyazaki | ......................... | 378/45 |
| 6,453,002 B1 * | 9/2002 | Mazor et al. | ..................... | 378/49 |
| 2002/0033457 A1 * | 3/2002 | Chalupka et al. | .......... | 250/491.1 |
| 2003/0031939 A1 * | 2/2003 | Butschke et al. | ................. | 430/5 |
| 2003/0035510 A1 * | 2/2003 | Strommer | .................... | 378/98.8 |
| 2003/0227604 A1 * | 12/2003 | Best et al. | ....................... | 355/51 |
| 2010/0290589 A1 * | 11/2010 | Izutsu | ............................. | 378/58 |

FOREIGN PATENT DOCUMENTS

| | | | |
|---|---|---|---|
| JP | 62144325 A | * | 6/1987 |
| JP | 2002350111 A | * | 12/2002 |

OTHER PUBLICATIONS

Translation for JP 62-144325 A published on Jun. 27, 1987.*

* cited by examiner

*Primary Examiner* — Glen Kao
(74) *Attorney, Agent, or Firm* — Innovation Counsel LLP

(57) ABSTRACT

The present invention discloses an apparatus and a method for detecting a mark as well as a semiconductor device processing system. In order to address the problem existing in the prior art that detection of a mark in a layer of a semiconductor device has a low accuracy, the present invention uses an X-ray emitter and an X-ray detector to image the mark contained in the layer of the semiconductor device supported on the supporting member. According to the present invention, due to the use of the X-ray, even if the mark is covered by multiple layers which are opaque to visible light, the mark may be clearly imaged.

25 Claims, 5 Drawing Sheets

APPARATUS AND METHOD FOR DETECTING MARKS AND SEMICONDUCTOR DEVICE PROCESSING SYSTEM

CROSS-REFERENCE TO RELATED APPLICATIONS

This application claims priority to Chinese Patent Application No. 201110300891.9, filed on Sep. 29, 2011 and entitled "Apparatus and Method for Detecting Marks and Semiconductor Device Processing System", which is incorporated herein by reference in its entirety.

BACKGROUND OF THE INVENTION

1. Field of the Invention

The present invention relates to the field of semiconductor techniques, and more specifically, relates to an apparatus and a method for detecting a mark in a layer of a semiconductor device as well as to a semiconductor device processing system.

2. Description of the Related Art

During the fabrication of a semiconductor device, a process of forming multiple layers on a wafer by using a mask plate is typically involved. In the formation process of the multiple layers, patterning of each layer by etching or the like may be involved. It is known that, in order to make patterns between multiple layers that are overlapped on a wafer align with respect to each other, alignment marks may be formed on each of these layers. By the alignment between the mask plate of the current layer and the alignment mark of the previous layer, it is possible to align the formed pattern on the current layer with the pattern on the previous layer. These alignment marks may have phase contrast (e.g. "topographical" contrast) or reflectivity contrast. Background lighting (generally, visible light) in a process environment is utilized to detect the phase contrast or the reflectivity contrast to obtain a phase contrast signal or a reflectivity contrast signal, thereby optically detecting or imaging these alignment marks.

Alignment marks may be covered by the current layer or by multiple layers that include the current layer. For the aforementioned prior art, in a case where the current layer to be patterned is a layer opaque to the visible light or a layer of low transmissivity to the visible light, or in a case where there is a layer opaque to the visible light or a layer of low transmissivity to the visible light between the current layer to be patterned and the layer with alignment marks, the visible light may be reflected or absorbed by the opaque layer or the layer of low transmissivity, and thus, may not reach the layer with alignment marks, as illustrated in FIG. 1 (in FIG. 1, layer 4 has for example a low transmissivity to the visible light and layer 3 is for example a layer substantially opaque to the visible light). In this case, the obtained phase contrast signal or reflectivity contrast signal may be significantly reduced, resulting in the inability to clearly image the marks. Directed to the problems existing in the prior art as found by the inventor, a new technical solution according to the present invention is proposed.

BRIEF SUMMARY OF THE INVENTION

The present invention is directed to an apparatus and method for detecting a mark in a layer of a semiconductor device, to improve the obtained phase contrast signal or reflectivity contrast signal and to allow the ability to clearly image the marks.

More specifically, according to one aspect of the present invention, an apparatus is provided for detecting a mark in a layer of a semiconductor device, comprising: an X-ray emitter for emitting X-ray; an X-ray detector; and a supporting member configured to support a semiconductor device comprising a layer which has a mark, and to enable said semiconductor device to be located on an optical path between said X-ray emitter and said X-ray detector; wherein, said X-ray detector may be configured to form an image of said mark by using the X-ray that has been transmitted through the semiconductor device supported on said supporting member.

According to a possible exemplary implementation, said supporting member may have an X-ray reflector configurable to reflect the X-ray that has been transmitted through said semiconductor device.

According to a possible exemplary implementation, the apparatus may further comprise an optical element configured to reflect the X-ray emitted from said X-ray emitter towards said semiconductor device, and transmit the X-ray which has been reflected by said X-ray reflector and which has been transmitted through said semiconductor device towards said X-ray detector.

According to a possible exemplary implementation, the apparatus may further comprise an optical element configured to transmit the X-ray emitted from said X-ray emitter towards said semiconductor device, and reflect the X-ray which has been reflected by said X-ray reflector and has been transmitted through said semiconductor device towards said X-ray detector.

According to a possible exemplary implementation, the apparatus may further comprise a shutter configured to selectively block or pass the X-ray emitted from said X-ray emitter.

According to a possible exemplary implementation, the above mentioned X-ray detector may comprise: a first device configured to convert the X-ray incident on said X-ray detector to visible light; a second device configured to converge said visible light; and a third device configured to perform photo-electric conversion by using the visible light that has been converged.

According to a possible exemplary implementation, the above mentioned X-ray detector may comprise a fourth device configured to convert the X-ray to an electric signal.

According to a possible exemplary implementation, the apparatus may further comprise a sixth device configured to detect a position and a shape of said mark from said image.

According to a possible exemplary implementation, said sixth device may communicate with an alignment sub-system of an exposure tool.

According to a possible exemplary implementation, said first device may be configured to function with a slit, the width of which may be consistent with the required resolution of the image.

According to a possible exemplary implementation, detection of said mark may be achieved by movement of the supporting member relative to the X-ray detector in a direction perpendicular to the incident direction of the X-ray.

According to a possible exemplary implementation, said first device may be a fluorescent converter.

According to a possible exemplary implementation, said second device may be a lens or a condenser.

According to a possible exemplary implementation, said third device may be an image sensor or a photo detector, such as a charge coupled device (CCD) or a complementary metal oxide semiconductor (CMOS) sensor, or such as a photo diode, a photo-multiplier tube or an avalanche photo detector.

According to a possible exemplary implementation, said mark may be alignment marks in the layer of the semiconductor device.

According to a possible exemplary implementation, said X-ray reflector may be a multi-coated reflector.

According to a possible exemplary implementation, said semiconductor device may include a semiconductor wafer and one or more layers.

According to a possible exemplary implementation, said supporting member may be configured to be movable along a direction that is in parallel with a supporting surface of said supporting member.

According to another aspect of the present invention, there is provided a semiconductor device processing system, comprising: the apparatus for detecting a mark in a layer of a semiconductor device as mentioned above; and an exposure tool configured to expose a semiconductor device supported on said supporting member, wherein, said semiconductor device may be applied with resist.

According to a further aspect of the present invention, there is provided a method of detecting a mark in a layer of a semiconductor device, comprising: placing a semiconductor device applied with resist on a supporting member, such that said semiconductor device may be located on an optical path between an X-ray emitter and an X-ray detector; emitting X-ray from said X-ray emitter such that said X-ray may be transmitted through said semiconductor device; and detecting the X-ray that has been transmitted through said semiconductor device by using said X-ray detector, thereby forming an image of said mark.

According to a possible exemplary implementation, the method may further comprise performing alignment between layers of the semiconductor device by using the formed image.

According to a possible exemplary implementation, the method may further comprise exposing the semiconductor device supported on the supporting member to light by using the exposure tool.

According to the present invention, alignment marks in the previous layer may be accurately detected even if these alignment marks are covered by one or more layers.

Further features and advantages of the present invention will become apparent from the following detailed description of exemplary embodiments of the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE INVENTION

Figure 1:
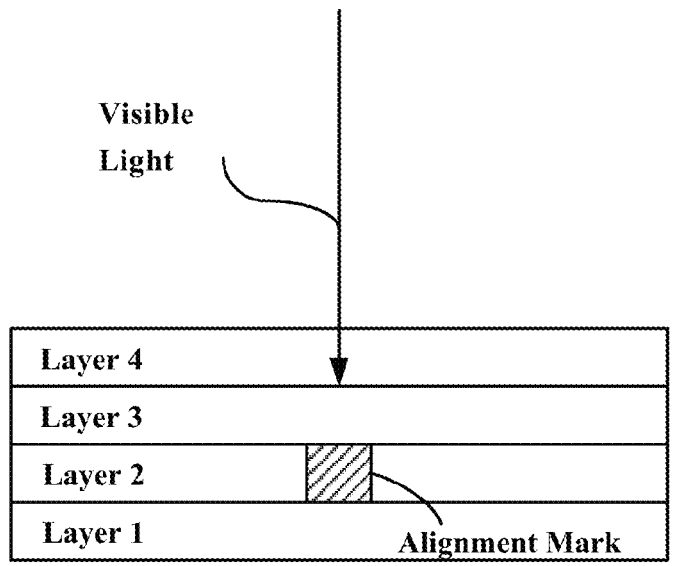
FIG. 1 is a view exemplarily showing alignment mark detection as known in the prior art.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is expressively stated otherwise.

Meanwhile, it should be noted that, for the convenience of description, each part shown in the figures has not necessarily been drawn to scale.

The following description of exemplary embodiments is merely illustrative in nature and is in no way intended to limit the invention, its application, or uses. Furthermore, in all of the examples illustrated and discussed herein, any specific values should be interpreted to be illustrative only and non-limiting unless it is expressively stated otherwise. Depending on actual design demands, other examples of the exemplary embodiments could certainly have different values.

Techniques, methods and apparatus as known by one of ordinary skill in the relevant art may not be discussed in detail in order not to obscure the concept of the present invention, but should be considered as a part of the granted patent specification when appropriate.

Please be noted that similar reference numerals and letters refer to similar items in the following figures, and thus, once an item is defined in one figure, it need not be further discussed for following figures.

In this disclosure, term "semiconductor device" means a device comprising a semiconductor material, which may include not only a finished semiconductor device product but also the midway (intermediate) product of a semiconductor device during the manufacturing or processing process.

Figure 2:
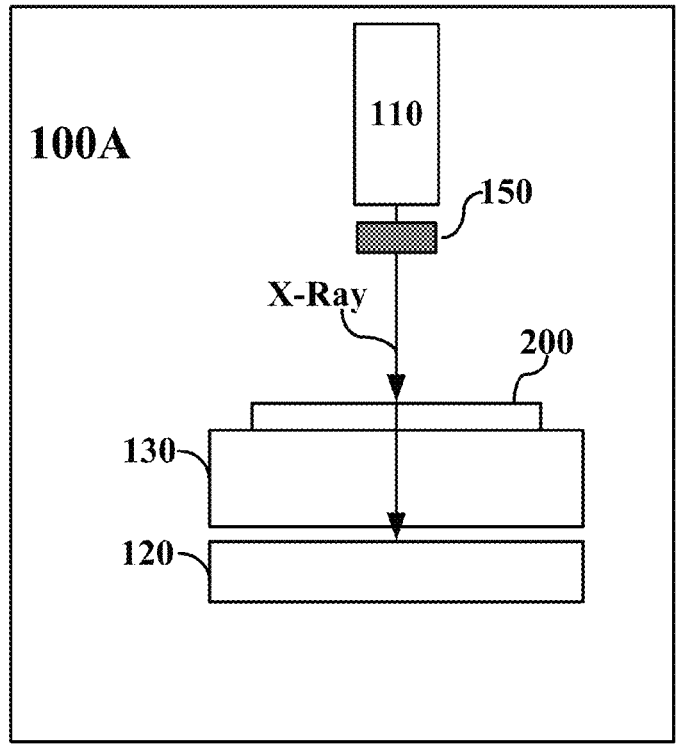
FIG. 2 is a schematic view exemplarily showing the configuration of an apparatus for detecting a mark in a layer of a semiconductor device according to an embodiment of the present invention.

As previously noted, the present invention is directed to an apparatus and method for detecting a mark in a layer of a semiconductor device, to improve the obtained phase contrast signal or reflectivity contrast signal and to allow the ability to clearly image the marks. FIG. 2 is a schematic view exemplarily showing the configuration of an apparatus for detecting a mark in a layer of a semiconductor device according to an embodiment of the present invention.

FIG. 2 shows an apparatus 100A for detecting a mark in a layer of a semiconductor device, wherein the apparatus 100A comprises: an X-ray emitter 110 for emitting X-ray; an X-ray detector 120; a supporting member 130 (e.g. a wafer table) configured to support the semiconductor device 200 and to enable said semiconductor device 200 to be located on an optical path between the X-ray emitter 110 and the X-ray detector 120. Semiconductor device 200 comprises a layer which has a mark. The X-ray detector 120 may be configured to form an image of said mark by using the X-ray that has been transmitted through the semiconductor device 200 supported on said supporting member 130. The X-ray emitter 110 may be configured to emit parallel collimated X-ray beam.

In the embodiment shown in FIG. 2, the X-ray emitted from the X-ray emitter 110 may be transmitted through the semiconductor device 200 that may be supported on the supporting member 130, may be transmitted through the supporting member 130, and then may be incident on the X-ray detector 120. However, this embodiment may not be limited to the arrangement shown in FIG. 2. The X-ray detector 120 may be configured as a part of said supporting member 130. For example, the X-ray detector 120 may be configured in said supporting member 130. In this situation, the X-ray emitted from the X-ray emitter 110 (1) may be transmitted through the semiconductor device 200 that may be supported on the supporting member 130, (2) may be transmitted through a portion of said supporting member 130, and (3) then may be incident on the X-ray detector 120. Alternatively, for example, the X-ray detector 120 may be configured on said supporting member 130. In this situation, the X-ray emitted from the X-ray emitter 110 may be transmitted through the semiconductor device 200 that may be supported on the supporting member 130, and then may be incident on the X-ray detector 120.

The semiconductor device 200 may include, for example, a semiconductor wafer and one or more layers. The layer structure of the semiconductor device 200 and the arrangement of the alignment mark may be, for example, as shown in FIG. 1, but are not limited to this configuration. The present invention may be applicable to various layer structures and alignment mark arrangements that are known in the art. It should be noted that the aforementioned apparatus 100A per se may not include the semiconductor device 200, but may be configured to be capable of working with the semiconductor device 200.

The X-ray may be a high-energy electromagnetic radiant ray with a wavelength of about 0.006 nm-about 2 nm. Compared to the visible light, the X-ray has a much stronger penetrability and may not destroy the object (e.g., the semiconductor device in the present invention) being irradiated.

The absorption of X-ray depends on the atomic number and other physical properties of a material (e.g., density of the material). The larger the density and the atomic number of the material, the larger the percentage that the X-ray may be absorbed by the material. Therefore, materials with different atomic number and/or physical properties have different transmissivity and/or absorption and/or reflectivity for X-ray with certain energy. Portions with alignment marks and portions without alignment marks in the layers of the semiconductor device 200 accordingly have different transmissivity and/or absorption and/or reflectivity for the X-ray. After the semiconductor device 200 has been irradiated with the X-ray, the reflected X-ray that has passed through the portions with alignment marks and the reflected X-ray that has passed through the portions without alignment marks are different in terms of intensity. For example, when the X-ray is incident on the alignment mark, energy of the X-ray may be substantially absorbed by the alignment mark. The X-ray detector 120 may measure the energy of the X-ray that has been transmitted through the alignment mark and the energy of the X-ray that may be only transmitted through the background area (i.e. portions without alignment marks). That is, the X-ray detector 120 may detect the difference in ratio of transmission of the X-ray energy that has been transmitted through different portions of the semiconductor device 200.

In one possible implementation, the X-ray detector 120 and the supporting member 130 may move relative to each other. This relative movement may be a two-dimensional movement along a direction that is in parallel with the plane of the supporting member 130, or a three-dimension movement in any direction. For example, at least one of the X-ray detector 120 and the supporting member 130 may be movable. In addition, the supporting member 130 may be movable relative to at least one of the X-ray detector 120 and the X-ray emitter 110. For example, the supporting member 130 may be configured to be movable in a direction which is in parallel with the supporting surface of the supporting member 130.

According to a possible implementation, the apparatus 100A may also be provided with a shutter 150 (e.g. interlocked shutter or the like) that may be configured to selectively block or pass the X-ray emitted from the X-ray emitter 110. By means of this shutter 150, it is possible to let the X-ray pass only when the X-ray may be required to be transmitted through the semiconductor device 200 and to prevent the X-ray from directly entering the X-ray detector 120 without being transmitted by the semiconductor device 200. According to another possible implementation, the X-ray detector 120 may detect the alignment mark by way of focal plane imaging or scanning, so as to obtain an image of the alignment mark.

Figure 3:
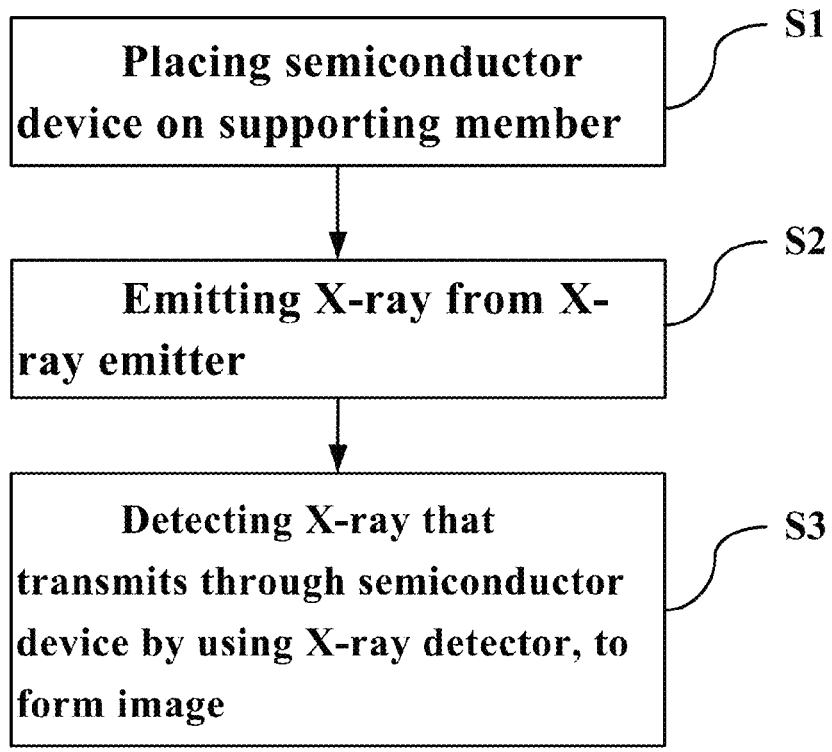
FIG. 3 is a flowchart exemplarily showing a method of detecting a mark in a layer of a semiconductor device according to an embodiment of the present invention.

FIG. 3 is a flowchart exemplarily showing a method of detecting a mark in a layer of a semiconductor device according to an embodiment of the present invention. The method in this flowchart may work with the apparatus for detecting a mark in a layer of a semiconductor device described with reference to any embodiment of the present invention.

In step S1, the semiconductor device 200 comprising the layer with the mark is placed on the supporting member 130 such that the semiconductor device 200 may be located on an optical path between the X-ray emitter 110 and the X-ray detector 120.

In Step S2, X-ray is emitted from the X-ray emitter 110 such that the X-ray may be transmitted through the semiconductor device 200.

In Step S3, the X-ray detector 120 may be used to detect the X-ray that has been transmitted through the semiconductor device 200, thereby to form an image of the mark.

With the above steps S1-S3, a clear and precise image of the alignment mark in the layer of the semiconductor device may be obtained.

In one implementation, after the above steps S1-S3, the formed image of the mark may be used for conducting the alignment between layers of the semiconductor device 200. For example, alignment between a mask plate with a pattern and the alignment mark may be conducted by obtaining position and shape information about the alignment mark from the formed image.

In one implementation, the current layer of the semiconductor device 200 may be applied with resist. In this situation, after conducting the above mentioned alignment, the semiconductor device 200 supported on the supporting member 130 may be exposed to light by using an exposure tool. The mask plate may be, for example, disposed together with the exposure tool.

Figure 4:
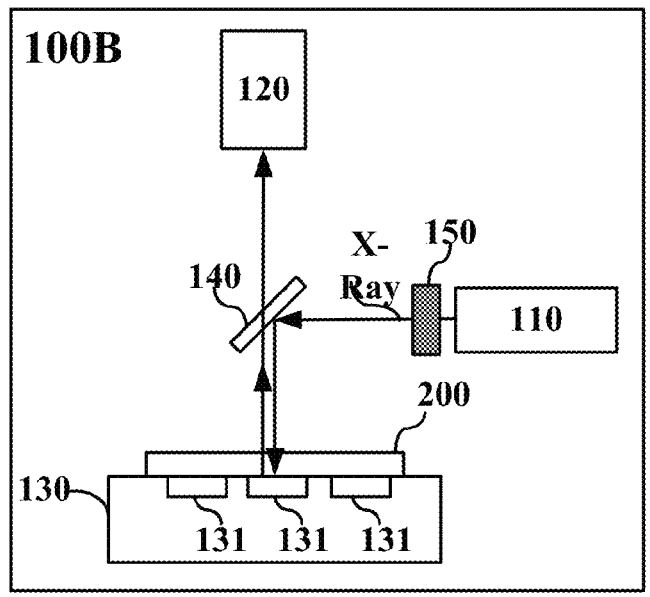
FIG. 4 is a schematic view exemplarily showing the configuration of an apparatus for detecting a mark in a layer of a semiconductor device according to an embodiment of the present invention.
Figure 5:
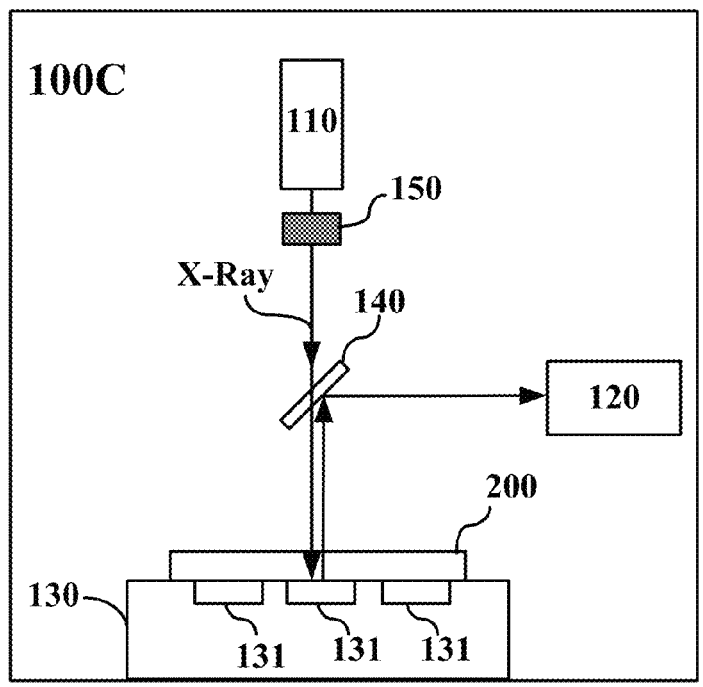
FIG. 5 is a schematic view exemplarily showing the configuration an apparatus for detecting a mark in a layer of a semiconductor device according to an embodiment of the present invention.

FIGS. 4 and 5 are schematic views for exemplarily showing the configuration of an apparatus for detecting a mark in a layer of a semiconductor device according to an embodiment of the present invention. FIG. 4 depicts apparatus 100B and FIG. 5 depicts apparatus 100C. Reference numbers in FIGS. 4 and 5 that are identical to those in FIG. 2 are used for indicating components similar to those in FIG. 2. Configurations, performances and methods for respective components that are described with reference to FIGS. 2 and 3 may also be applied to the configurations shown in FIGS. 4 and 5, unless it is expressively stated otherwise.

As shown in FIGS. 4 and 5, the supporting member 130 may have an X-ray reflector 131 configurable to reflect the X-ray that has been transmitted through the semiconductor device 200.

In one implementation, the X-ray reflector 131 may be a multi-coated reflector or the like. However, the X-ray reflector 131 may not limited to any particular example, it is sufficient if it may reflect X-ray with a high reflectivity (e.g., 50% or higher, preferably, 70% or higher). A plurality of X-ray reflectors 131 that approximately correspond to the positions of the alignment marks may be arranged as shown in FIGS. 4 and 5, or an integrated X-ray reflector 131 may be arranged over a range corresponding to the entire semiconductor device 200.

As shown in FIGS. 4 and 5, the apparatus 100B and apparatus 100C may further include an optical element 140. The optical element 140 may be, for example, a beam splitter such as a half transparent and half reflecting lens. One portion of the X-ray that is incident on the optical element 140 may travel in a first path (for example, be reflected), while the other portion of the X-ray that incident on the optical element 140 may travel in a second path which is different from the first path (for example, be transmitted).

In the embodiment shown in FIG. 4, the optical element 140 may be configured to reflect the X-ray emitted from the X-ray emitter 110 towards the semiconductor device 200, and to transmit the X-ray that has been reflected by the X-ray reflector 131 and that has been transmitted by the semiconductor device 200 towards the X-ray detector 120. More specifically, the X-ray emitted from the X-ray emitter 110 may be reflected towards the supporting member 130 by the optical element 140, the X-ray reflected by the optical element 140 may be transmitted through the semiconductor device 200, the X-ray that has been transmitted through the semiconductor device 200 may be reflected by the X-ray reflector 131, the X-ray reflected by the X-ray reflector 131 may be again transmitted through the semiconductor device 200, and the X-ray that has been again transmitted through the semiconductor device 200 may be transmitted through the optical element 140 and may be incident on the X-ray detector 120. Although not shown in the figure, a portion of the X-ray emitted from the X-ray emitter 110 and incident on the optical element 140 may be transmitted by the optical element 140 and another device may be used for receiving the portion of the X-ray that may be transmitted through the optical element 140. Furthermore, a portion of the X-ray reflected by the X-ray reflector 131 and transmitted by the semiconductor device 200 may be reflected by the optical element 140 to go back to the X-ray emitter 110 or to be received by another device.

In the embodiment shown in FIG. 5, the optical element 140 may be configured to transmit the X-ray emitted from the X-ray emitter 110 towards the semiconductor device 200, and to reflect the X-ray reflected by the X-ray reflector 131 and transmitted by the semiconductor device 200 towards the X-ray detector 120. More specifically, the X-ray emitted from the X-ray emitter 110 is transmitted through the optical element 140, the X-ray transmitted through the optical element 140 may be transmitted through the semiconductor device 200, the X-ray that has been transmitted through the semiconductor device 200 may be reflected by the X-ray reflector 131, the X-ray reflected by the X-ray reflector 131 may be again transmitted through the semiconductor device 200, and the X-ray that has been again transmitted through the semiconductor device 200 may be reflected by the optical element 140 towards the X-ray detector 120 and may be incident on the X-ray detector 120. Although not shown in the figure, a portion of the X-ray that may be emitted from the X-ray emitter 110 and incident on the optical element 140 may be reflected by the optical element 140 to be received by another device. Furthermore, a portion of the X-ray that may be reflected by the X-ray reflector 131 and transmitted by the semiconductor device 200 may be transmitted by the optical element 140 to go back to the X-ray emitter 110 or to be received by another device.

Various implementations in which an X-ray reflector and an optical element are provided have been described above. However, the present invention may not be limited to these particular implementations. After reading the present disclosure, one of ordinary skill in the art may conceive various arrangements of other optical elements comprising X-ray reflectors and/or X-ray beam splitters, so long as these arrangements may cause the X-ray emitted from the X-ray emitter 110 to be transmitted through the semiconductor device 200 and cause the X-ray that has been transmitted through the semiconductor device 200 to be incident on the X-ray detector 120.

Figure 6:
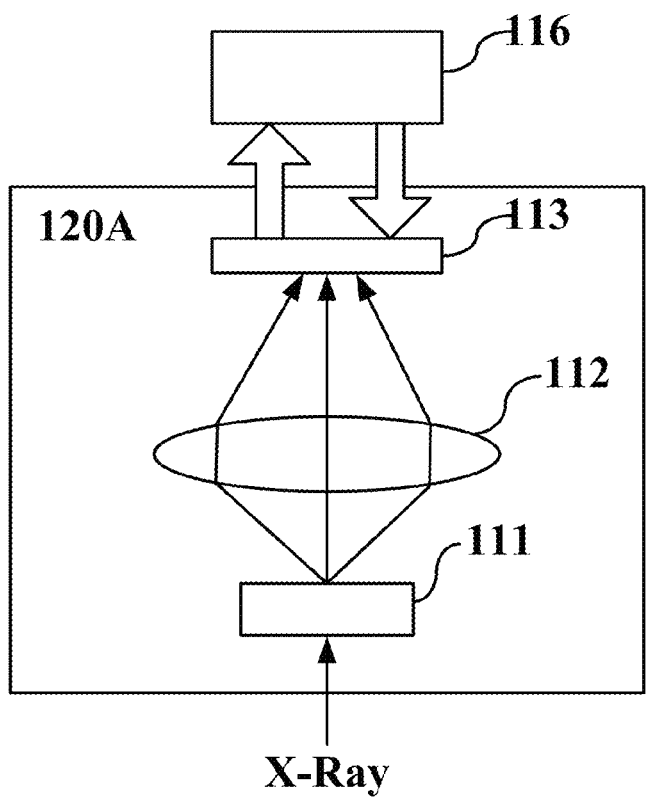
FIG. 6 is a schematic view exemplarily showing the configuration of an X-ray detector according to an embodiment of the present invention.
Figure 7:
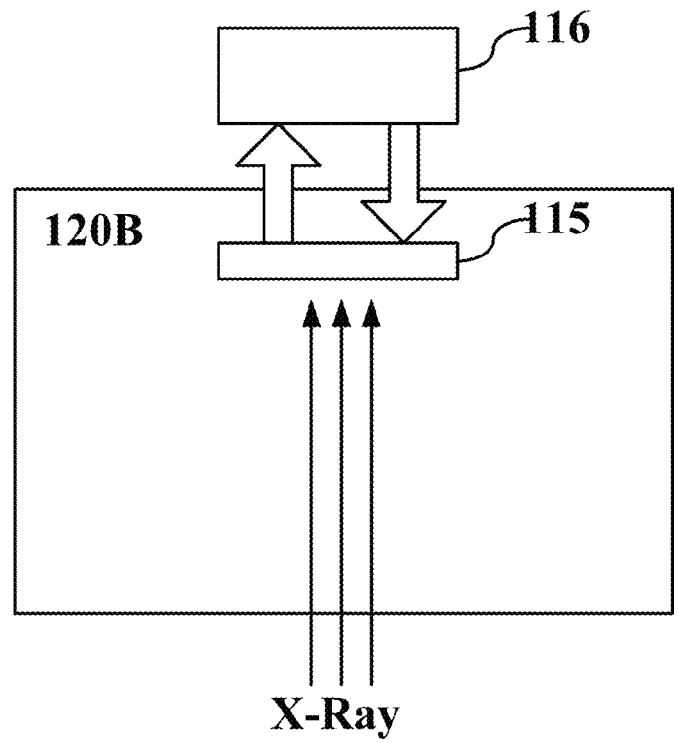
FIG. 7 is a schematic view exemplarily showing the configuration of an X-ray detector according to another embodiment of the present invention.
Figure 8:
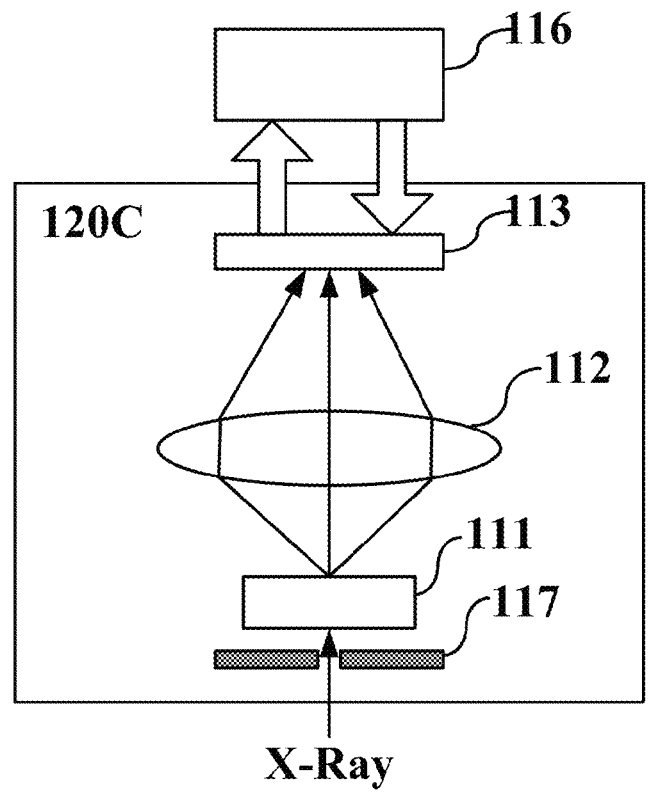
FIG. 8 is a schematic view exemplarily showing the configuration of an X-ray detector according to a further embodiment of the present invention.

FIGS. 6-8 are schematic views exemplarily showing multiple configurations of the X-ray detector 120 of FIG. 4, as illustrated by X-ray detectors 120A, 120B and 120C, of FIG. 6-8, respectively, according to the embodiments of the present invention. In the configuration of the X-ray detector 120A and 120B shown in FIGS. 6 and 7, respectively, the image of the alignment mark may be obtained by way of focal plane imaging. In the configuration of the X-ray detector 120C shown in FIG. 8, the image of the alignment mark may be obtained through scanning.

The X-ray detector 120A shown in FIG. 6 may include, for example, a first device 111 configured to convert the X-ray incident on the X-ray detector 120A (i.e. the X-ray that has been transmitted through the semiconductor device 200) to visible light, a second device 112 configured to converge (optically images) the visible light, and a third device 113 configured to perform photo-electric conversion using the visible light that has been converged.

The first device 111 of FIG. 6 may consist of for example an array of fluorescence converters. However, the first device 111 may not be limited to any particular examples, so long as it may perform wavelength conversion for converting the X-ray to visible light. The second device 112 may consist of for example a lens or a condenser, for example. The second device 112 may not limited to any particular examples, so long as it may converge the visible light (perform imaging by using visible light). The third device 113 may be, for example, an array-type image sensor such as a charge coupled device, a complementary metal oxide semiconductor sensor or an array of photo detectors. The third device 113 may not be limited to any particular example, so long as it may serve as an image plane for the second device 112 such that the imaging light from the second device 112 may be subjected to photo-electric conversion.

According to a possible implementation, the third device 113 may conduct a progressive linear scanning and then form a planar image to be output. Alternatively, the third device 113 may conduct a plane scanning thereby to directly form a planar image to be output.

FIG. 7 shows another implementation of the X-ray detector 120B. The X-ray detector 120B shown in FIG. 7 may include, for example, a fourth device 115 configured to convert the X-ray to an electric signal. Different from the embodiment shown in FIG. 6, in the embodiment shown in FIG. 7, it is unnecessary for the X-ray to undergo two-stage conversion to be converted to an electric signal; instead it may be possible to convert the X-ray directly to an electric signal by use of the fourth device 115. The fourth device 115 may be, for example, an array of wavelength converters using amorphous selenium as the X-ray conversion material. However, the fourth device 115 may not be limited to any particular examples, so long as it may convert the incident X-ray to an electric signal.

According to a possible implementation, the fourth device 115 may perform a progressive linear scanning, and then form a planar image to be output. Alternatively, the fourth device 115 may perform a planar scanning, thereby to directly form a planar image to be output.

FIG. 8 is a schematic view exemplarily showing the configuration of an X-ray detector according to still another embodiment of the present invention. As shown in FIG. 8, the first device 111 may be configured to function with a slit 117, and the width of the slit 117 may be consistent with the required resolution of the image. The visible light generated through the wavelength conversion by the first device 111 may be passed to the second device 112 via the slit. The second device 112 converges (optically images) the incident light. The third device 113 converts the converged light to an electric signal (photo-electric conversion).

In this situation, detection of the mark may be achieved by movement of the supporting member 130 relative to the X-ray detector 120C in a direction perpendicular to the incident direction of the X-ray. The above imaging and photo-electric conversion processes may be repeated for each position of movement of the supporting member 130. Then, image signals may be reconstructed from electric signals corresponding to respective positions of movement of the supporting member 130.

In the embodiment shown in FIG. 8, the third device 113 may be, for example, a photo detector such as a photo diode, a photo-multiplier tube (PMT) or an avalanche photo detector (APD). However, the third device 113 may not be limited to any particular examples, so long as it may convert visible light to an electric signal.

The third device 113 shown in FIG. 8 is able to conduct, for example, linear scanning (that is, the pattern obtained from scanning may be a straight line) and multiple straight lines may be arranged and reconstructed into a two-dimensional image.

According to a possible implementation, the apparatuses 120A, 120B or 120C may further include a sixth device 116 (e.g. a controller). The sixth device 116 may be coupled to the third device 113 (or the fourth device 115) to obtain the electric signal or image generated by the third device 113 (or the fourth device 115). In addition, the sixth device 116 may communicate with the alignment sub-system of the exposure tool. More specifically, the sixth device 116 may be configured to detect a position and a shape of the alignment mark from the image. According to a possible implementation, the sixth device 116 may also be configured to perform alignment with the projected pattern of the mask plate by using the detected position and shape of the alignment mark.

Although the sixth device 116 is included in the apparatuses 120A, 120B or 120C, according to the above description, it may be possible that the apparatuses 120A, 120B or 120C does not include a sixth device 116, but may communicate with the sixth device 116 that is a separate device.

Figure 9:
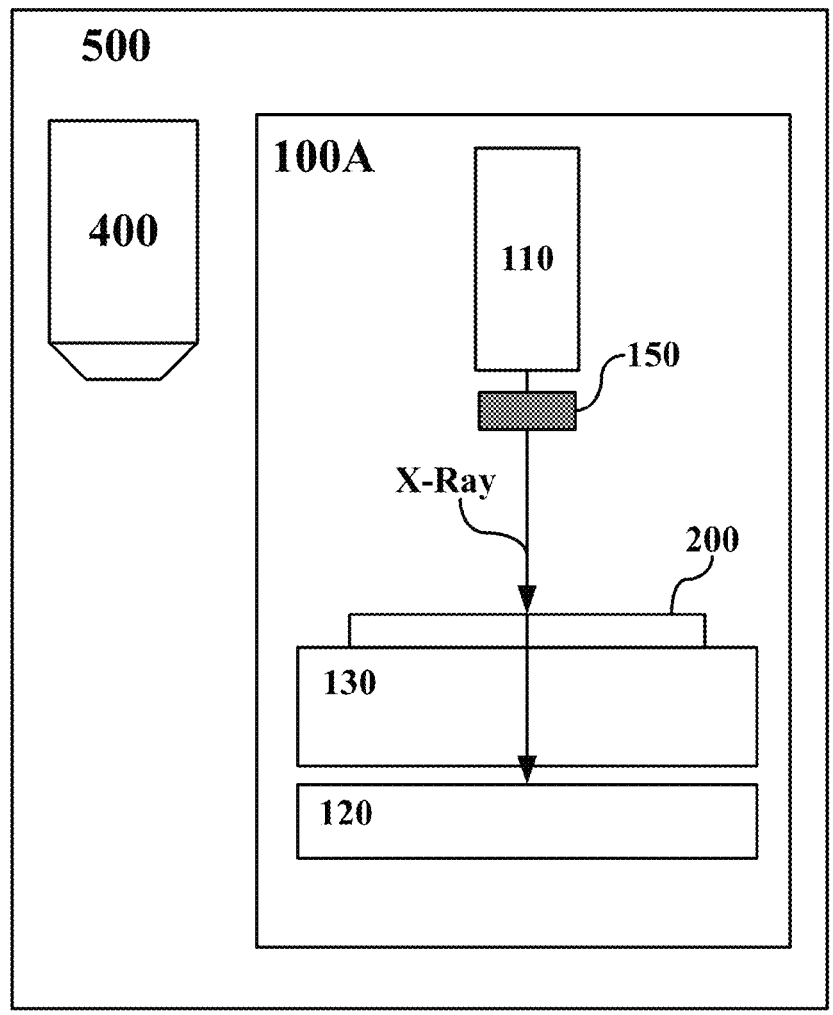
FIG. 9 is a schematic view exemplarily showing the configuration of a semiconductor device processing system according to an embodiment of the present invention.

FIG. 9 is a schematic view exemplarily showing the configuration of a semiconductor device processing system according to an embodiment of the present invention. As shown in FIG. 9, the semiconductor device processing system 500 may comprise: the apparatus 100A for detecting the mark in the layer of the semiconductor device as mentioned before; and an exposure tool 400 configured to expose the semiconductor device 200 that may be applied with resist and supported on the supporting member 130. The exposure tool 400 may be an exposure tool for exposing various resists to light. The exposure tool 400 may be, for example, provided with a mask plate for patterning the resist. Other embodiments may be implemented with apparatuses 100B and 100C.

According to a possible implementation, the exposure tool 400 and the apparatus 100A may be relatively fixed in a spatial position, and may be regularly calibrated according to the calibration requirements of the apparatus 100A and the exposure tool 400 by the lithography machine known in the art.

According to the present invention, by virtue of the use of X-ray, even if the alignment mark is covered by multiple layers that are opaque to visible light, the alignment mark may be clearly imaged. Thus, it may be possible to accurately detect the position and the shape of the alignment mark.

So far, various possible embodiments according to the present invention have been described in detail. In order to not obscure the concept of the present invention, some details already known in the art are not described herein. One of ordinary skill in the art can absolutely know how to implement the technical solutions disclosed herein based on the above description.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments may be modified without departing from the scope and spirit of the present invention. The scope of the present invention is defined by the attached claims.

What is claimed is:

1. An apparatus for detecting a mark in a layer of a semiconductor device, the apparatus comprising:
   an X-ray emitter for emitting an X-ray;
   an X-ray detector;
   an optical element configured to at least partially reflect the X-ray emitted from said X-ray emitter towards said semiconductor device; and
   a supporting member configured to support said semiconductor device and comprising a first X-ray reflector,
   wherein said X-ray detector is configured to detect at least one of a position of said mark and a shape of said mark using a signal related to a transmitted portion of the X-ray that has been transmitted through the semiconductor device supported on said supporting member,
   wherein said first X-ray reflector is configured to at least partially reflect said transmitted portion of the X-ray to produce a reflected portion of the X-ray, and
   wherein said X-ray detector comprises a conversion device configured to convert, without using visible light, said portion of the X-ray to an electric signal.

2. The apparatus according to claim 1, wherein the optical element is configured to at least partially transmit said reflected portion of the X-ray towards said X-ray detector, and wherein said supporting member further comprises a second X-ray-reflector that is spaced from said first X-ray reflector.

3. The apparatus according to claim 2, wherein said X-ray detector and said X-ray emitter are disposed at a same side with respect to said supporting member.

4. The apparatus according to claim 1, further comprising: a shutter configured to either selectively block or pass the X-ray emitted from said X-ray emitter.

5. The apparatus according to claim 1, further comprising: an imaging device configured to form an image associated with said mark.

6. The apparatus according to claim 1, wherein said X-ray detector is configured to communicate with an alignment sub-system of an exposure tool.

7. The apparatus according to claim 1, wherein said mark is an alignment mark in the layer of the semiconductor device.

8. The apparatus according to claim 1, wherein said semiconductor device comprises a semiconductor wafer and one or more layers.

9. The apparatus according to claim 1, wherein said supporting member is movable along a direction which is in parallel with a supporting surface of said supporting member.

10. The apparatus according to claim 1, wherein said X-ray emitter is configured to emit a collimated X-ray beam.

11. An apparatus for detecting a mark in a layer of a semiconductor device, the apparatus comprising:
  an X-ray emitter configured to emit an X-ray;
  an X-ray detector configured to detect at least one of a position of said mark and a shape of said mark using a signal related to a transmitted portion of the X-ray that is transmitted through said semiconductor device;
  an optical element configured to at least partially reflect the X-ray emitted from said X-ray emitter towards said semiconductor device; and
  a supporting member configured to support said semiconductor device and comprising an X-ray reflector that is configured to at least partially reflect said transmitted portion of the X-ray to produce a reflected portion of the X-ray.

12. The apparatus according to claim 11, wherein the optical element is configured to transmit said reflected portion of the X-ray towards said X-ray detector, and wherein said X-ray reflector is positioned between two portions of said supporting member.

13. The apparatus according to claim 11, wherein said X-ray reflector comprises a multi-coated reflector.

14. The apparatus according to claim 11, wherein said X-ray detector comprises: a first device configured to convert an X-ray wavelength to produce a generated visible light; a second device configured to converge said generated visible light to produce a converged visible light; and a third device configured to perform photo-electric conversion on the converged visible light.

15. The apparatus according to claim 14, wherein said first device is configured to function with a slit, width of the slit being consistent with required resolution of an image formed by the X-ray detector.

16. The apparatus according to claim 15, wherein detection of said mark is achieved by movement of the supporting member relative to the X-ray detector in a direction perpendicular to incident direction of the X-ray.

17. The apparatus according to claim 15, wherein said third device comprises at least one of a photo diode, a photomultiplier tube, and an avalanche photo detector.

18. The apparatus according to claim 14, wherein said first device comprises a fluorescent converter.

19. The apparatus according to claim 14, wherein said second device comprises at least one of a lens and a condenser.

20. The apparatus according to claim 14, wherein said third device comprises at least one of an image sensor and a photo detector.

21. The apparatus according to claim 20, wherein said third device comprises at least one of a charge coupled device and a complementary metal oxide semiconductor sensor.

22. A semiconductor device processing system for processing a semiconductor device, said semiconductor device comprising a mark, the semiconductor device processing system comprising:
  an X-ray emitter configured to emit an X-ray;
  an X-ray detector configured to detect at least one of a position of said mark and a shape of said mark using a signal related to a portion of the X-ray that is transmitted through said semiconductor device;
  an optical element configured to at least partially reflect the X-ray emitted from said X-ray emitter towards said semiconductor device;
  an X-ray reflector configured to at least partially reflect said transmitted portion of the X-ray to produce a reflected portion of the X-ray, wherein the optical element is configured to transmit said reflected portion of the X-ray towards said X-ray detector; and
  a supporting member comprising said X-ray reflector and configured to support said semiconductor device;
  an exposure tool configured to expose said semiconductor device supported on said supporting member to a light,
  wherein the X-ray emitter and the X-ray detector are disposed at a same side with respect to the supporting member.

23. A method of detecting a mark in a layer of a semiconductor device, said semiconductor being applied with a resist, the method comprising:
  placing said semiconductor device on a supporting member that comprises an X-ray reflector;
  emitting an X-ray from an X-ray emitter and using an optical element to at least partially reflect said X-ray towards said semiconductor device, wherein a portion of said X-ray is transmitted through said semiconductor device and reflected by said X-ray reflector; and
  using an X-ray detector and said portion of said X-ray to detect at least one of a position of said mark and a shape of said mark.

24. The method according to claim 23, further comprising: forming a formed image of said mark; and performing alignment between layers of the semiconductor device using the formed image.

25. The method according to claim 24, further comprising: exposing the semiconductor device supported on the supporting member to light using an exposure tool.

* * * * *